(12) United States Patent
Ho

(10) Patent No.: US 10,580,478 B2
(45) Date of Patent: Mar. 3, 2020

(54) SYSTEMS AND METHODS FOR GENERATING STAGGER DELAYS IN MEMORY DEVICES

(71) Applicant: Micron Technology, Inc., Boise, ID (US)

(72) Inventor: Michael V. Ho, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/593,675

(22) Filed: Oct. 4, 2019

(65) Prior Publication Data

US 2020/0035290 A1 Jan. 30, 2020

Related U.S. Application Data

(62) Division of application No. 15/924,757, filed on Mar. 19, 2018, now Pat. No. 10,460,791.

(60) Provisional application No. 62/631,750, filed on Feb. 17, 2018.

(51) Int. Cl.
| | |
|---|---|
| *G11C 11/16* | (2006.01) |
| *G11C 11/4076* | (2006.01) |
| *G11C 7/22* | (2006.01) |
| *G11C 11/4093* | (2006.01) |
| *G06F 13/16* | (2006.01) |
| *G11C 7/10* | (2006.01) |

(52) U.S. Cl.
CPC ...... *G11C 11/4076* (2013.01); *G06F 13/1684* (2013.01); *G11C 7/22* (2013.01); *G11C 7/222* (2013.01); *G11C 11/4093* (2013.01); *G11C 7/1057* (2013.01); *G11C 2207/229* (2013.01); *G11C 2207/2254* (2013.01); *G11C 2207/2281* (2013.01)

(58) Field of Classification Search
CPC ... G11C 11/16; G11C 13/0002; G11C 13/004; G11C 13/0061; G11C 13/0069
See application file for complete search history.

(56) References Cited

U.S. PATENT DOCUMENTS

| | | | |
|---|---|---|---|
| 5,859,552 A | 1/1999 | Do et al. | |
| 9,536,591 B1 | 1/2017 | Kwak | |
| 9,621,138 B1 | 4/2017 | Zhang et al. | |
| 10,176,858 B1 * | 1/2019 | Wilmoth | G11C 8/18 |
| 2008/0036516 A1 | 2/2008 | Fort et al. | |
| 2008/0122510 A1 | 5/2008 | Mei | |
| 2008/0143406 A1 | 6/2008 | Im et al. | |
| 2011/0317317 A1 * | 12/2011 | Liu | H03K 17/284 |
| | | | 361/56 |
| 2015/0055431 A1 * | 2/2015 | Lin | H04L 25/03343 |
| | | | 365/230.06 |

(Continued)

*Primary Examiner* — Hien N Nguyen
(74) *Attorney, Agent, or Firm* — Fletcher Yoder, P.C.

(57) ABSTRACT

A semiconductor device may include a number of memory banks, an output buffer that couples to the memory banks, a number of switches that couple a voltage source to the output buffer, and a stagger delay circuit. The stagger delay circuit may include a resistor-capacitor (RC) circuit that outputs a current signal that corresponds to a data voltage signal received by the RC circuit. The stagger delay circuit may also include a logic circuit that determines a strength of the current signal and sends a first gate signal to a first portion of the switches based on the strength.

20 Claims, 3 Drawing Sheets

(56) References Cited

U.S. PATENT DOCUMENTS

2018/0167057 A1\* 6/2018 Pan ...................... H03K 3/011
2018/0232042 A1  8/2018 Kim

\* cited by examiner

SYSTEMS AND METHODS FOR GENERATING STAGGER DELAYS IN MEMORY DEVICES

CROSS REFERENCE TO RELATED APPLICATIONS

This application is a Divisional Application of U.S. patent application Ser. No. 15/924,757, entitled "Systems and Methods for Generating Stagger Delays in Memory Devices", filed Mar. 19, 2018, which is a Non-Provisional Application claiming priority to U.S. Provisional Patent Application No. 62/631,750, entitled "Systems and Methods for Generating Stagger Delays in Memory Devices", filed Feb. 17, 2018, each of these applications is herein incorporated by reference.

BACKGROUND

Field of the Present Disclosure

Embodiments of the present disclosure relate generally to the field of semiconductor devices. More specifically, embodiments of the present disclosure relate to incorporating delays to account for variable process, temperature, and voltage properties associated with read and write operations for memory devices.

Description of Related Art

A semiconductor device, such as a microcomputer, memory, gate array, among others, may receive data that is to be written into a memory cell or read from a memory cell. When data is being received by the semiconductor device, the semiconductor device may initially receive the data (e.g., low voltage or high voltage) in an output buffer. To ensure that the data produced at the output buffer is read accurately by a corresponding memory component, the output buffer should produce a voltage signal that has a certain slew rate, which may be defined as a change in voltage per unit of time (e.g., V/s). The slew rate may be defined for each individual type of memory component based on certain properties associated with the operation of the memory component, such as temperature, voltage, manufacturing process, noise, and the like. As memory components become capable of producing data at higher frequencies, the slew rate of an output voltage signal may become more difficult to control. Embodiments described herein detail the design and architecture in which circuit components may be incorporated into a semiconductor device to control the slew rate of a provided voltage signal.

DETAILED DESCRIPTION

Figure 1:
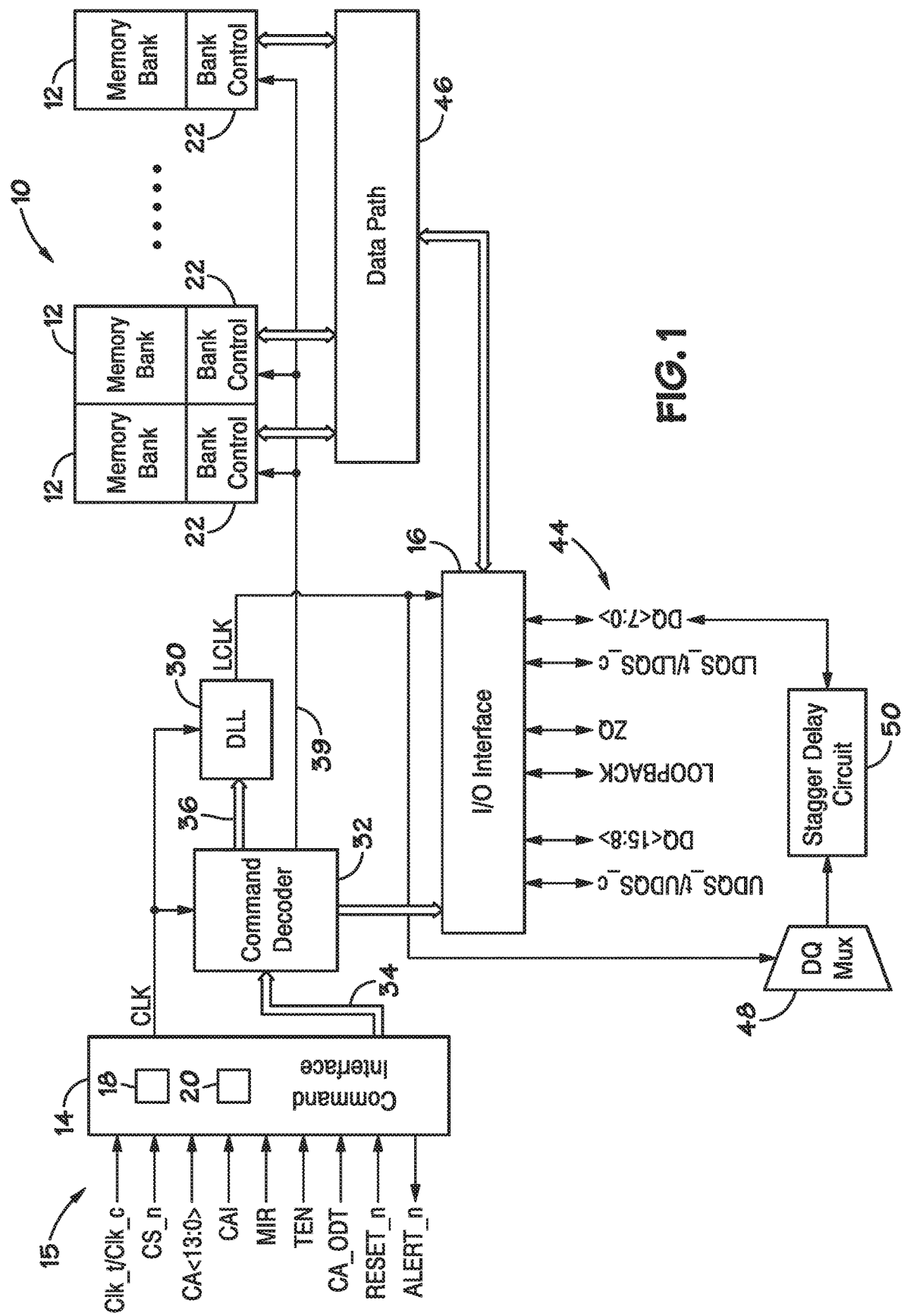
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed above, for different process, voltage, and/or temperature parameters of a memory device (e.g., double data rate dynamic random-access memory (DDR DRAM)), delays may be used to stagger the connection of a voltage source (e.g., VDDQ) to the memory device to control the slew rate of a voltage signal that is provided to the memory device. In DRAM, the slew rate corresponds to a change of voltage per unit of time and may be measured in volts per second (V/s).

With the foregoing in mind, when data provided to the memory device transitions from a low voltage value (e.g., VOL, output low voltage) to a high voltage value (e.g., VOH, output high voltage), the voltage source may be coupled to the output buffer via a number of switches (e.g., metal-oxide-semiconductor field-effect transistor (MOSFET)) in phases to control the slew of the voltage signal provided to the output buffer. For example, two switches of four parallel-coupled switches may initially be turned on (e.g., closed) to connect the voltage source to the output buffer for a first period of time and then all four switches may be turned on to connect the voltage source to the output buffer. When the output buffer is initially connected to two parallel-coupled switches, the relatively higher impedance, as compared to the four parallel-coupled switches, may cause the slew rate of the voltage signal provided to the output buffer (e.g. via a capacitor) to be lower, as compared to the slew rate of the voltage signal when all four parallel-coupled switches are coupled to the output buffer.

Generally, different memory devices specify different slew rates for expected voltage signals to ensure that a clock of the memory device accurately produces the voltage signal that corresponds to output data. The specification may thus provide minimum or maximum limits on the voltage slew rates under certain conditions (e.g. output loadings, data patterns, and noise profiles). As such, the specification for the memory device may ensure that the speed of the voltage signal (e.g., output signal) transition will be at least the given minimum for driving the memory device but at most the given maximum for limiting high frequency noise, which may cause undesirable effects, such as data bus ringing, voltage undershoots, voltage overshoots, and the like.

By way of example, if the data represents a binary 1, the voltage signal provided to the memory device should be a high voltage (e.g., VOH). However, if the slew rate of the voltage signal produced by the output buffer coupled to the memory device is above a specified maximum threshold, the voltage signal may exceed the expected high voltage value, which may damage the memory device and other devices in system. Conversely, if the slew rate of the voltage signal received by the output buffer coupled to the memory device is below a specified minimum threshold, the voltage signal may not reach the expected high voltage value before the output buffer is sampled by the memory device based on a respective clock cycle. As a result, the memory device may incorrectly produce a binary 0 value, as opposed to the binary 1 value provided by the data.

Keeping this in mind, the present embodiments include a system for controlling the slew rate of voltage signals provided to memory devices that may have high-frequency clocks. In one embodiment, a stagger delay circuit, which is less variable due to process, temperature, and voltage properties, may be incorporated into the memory device to reduce the variable time delays between the staggering different connections (e.g., phases, legs) between the voltage source and the output buffer to ensure that the slew rate of the voltage signal is within a specified range. The stagger delay circuit may include a resistor-capacitor (RC) circuit that receives a data signal that corresponds to a binary value. The RC circuit may output an analog current value based on the provided data signal and the resistance and capacitance of the RC circuit. The current output by the RC circuit may be received by a logic circuit that may detect the strength of the current output. The logic circuit may control the switching of different sets of switches that couple the voltage source to the output buffer. To ensure that each set of switches are turned on (e.g., closed) after some constant delay, the logic circuit may send a respective gate signal to the gates of each set of switches based on the strength of the current output. That is, the logic circuit may send a first gate signal to a first set of switches when the current value is above a threshold and may send a second gate signal to a second set of switches when the current value is below the threshold. By employing the time delay associated with the RC circuit, the stagger delay circuit may ensure that different sets of switches are turned on after certain constant intervals of time, thereby controlling the slew rate of the voltage signal provided to the output buffer. In addition, the stagger delay circuit may be designed for less variable of process, temperature and voltage and thus, can improve the slew rate performance in the noisy, high frequency systems. Additional details with regard to the operations of the stagger delay circuit will be discussed below with reference to FIGS. 1-5.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5 SDRAM) device. Various features of DDR5 SDRAM allow for reduced power consumption, more bandwidth, increased speed (e.g., clocking frequency), and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 may provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 39. As will be appreciated, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12.

In certain embodiments, the memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal, which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10 based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

In certain embodiments, the memory device 10 may receive data to be written into the memory bank 12 via a DQ multiplexer (MUX) 48. The data multiplexed via the DQ MUX 48 may be provided to stagger delay circuit 50, which may be coupled to the IO interface 16. As mentioned above, the stagger delay circuit 50 may include circuit components that control a slew rate of the voltage signal provided to an output buffer, which may be coupled to the IO interface 16. The voltage signal represents the data provided to the IO interface 16. Additional details with regard to the components and operation of the stagger delay circuit 50 will be described below with reference to FIGS. 2-5.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
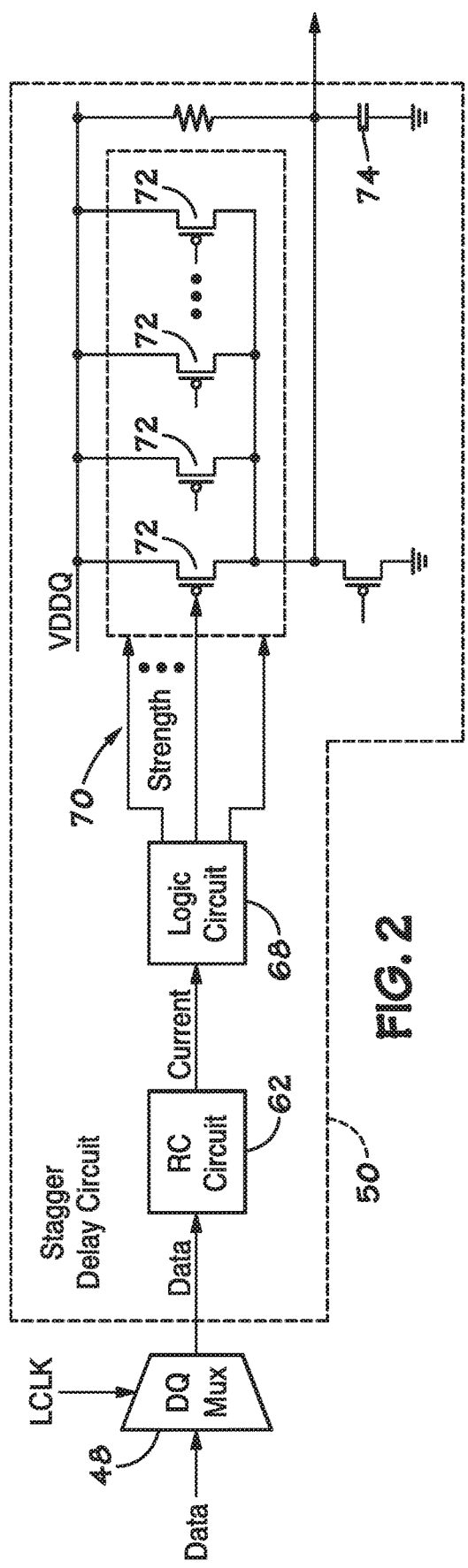
FIG. 2 is a simplified block diagram illustrating stagger delay circuitry within the memory device of FIG. 1, according to an embodiment of the present disclosure.
Figure 3:
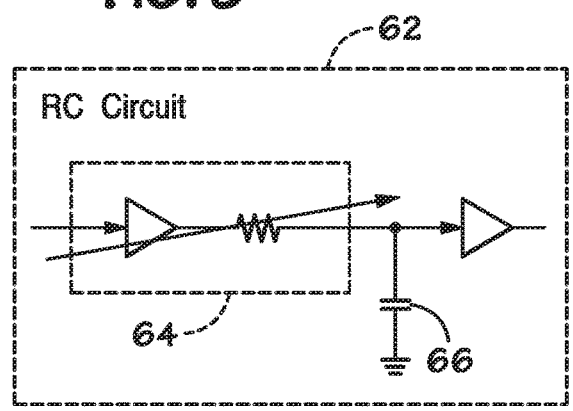
FIG. 3 illustrates a simplified block diagram of an resistor-capacitor (RC) circuit that may be part of the stagger delay circuitry of FIG. 2, according to an embodiment of the present disclosure.

Keeping the foregoing in mind, FIG. 2 illustrates a block diagram of the stagger delay circuit 50 and the components therein. As mentioned above, the stagger delay circuit 50 may receive data via the DQ MUX 48, which may multiplex data to the stagger delay circuit 50 based on the phase controlled internal clock signal LCLK. The incoming data may be provided to a resistor-capacitor (RC) circuit 62. The RC circuit 62 may be any suitable RC electrical circuit that may be driven by a voltage or current source. The RC circuit 62 may be designed based on the specifications of the memory device 10 to enable the stagger delay circuit 50 to provide timing signals to certain switches. FIG. 3 illustrates example components that may be part of the RC circuit 62.

Referring to FIG. 3, the RC circuit 62 may include a number of fuse circuits 64 that may control the amount of resistance present in the RC circuit 62 and a capacitor 66. That is, each fuse circuit 64 may be coupled to each other in parallel, in series, or in some other suitable combination, such that the equivalent resistance of all of the fuse circuits 64 may provide some resistance value. Based on different properties of each individual memory device 10 and the ability of the stagger delay circuit 50 to provide timing signals with appropriate delays to ensure that the slew rate of the voltage signal provided to the output buffer is within a specified range, certain fuse circuits 64 may be shorted or removed to adjust the total resistance of the RC circuit 62. That is, when data is received by the RC circuit 62, the current charging the capacitor 66 may initially be higher as compared to the current received by the capacitor 66 as the capacitor 66 charges. The initial current received by the capacitor 66 may be a may be $V_{data}/R$, where $V_{data}$ corresponds to the received data voltage and R corresponds to the equivalent resistance of the RC circuit 62. As the capacitor 66 charges, the current received by the capacitor 66 is reduced according to the properties of the RC circuit 62.

Keeping this in mind and referring back to FIG. 2, the current charging the capacitator 66 may be output by the RC circuit 62 and provided to a logic circuit 68. The logic circuit 68 may include hardware components (e.g., flip-flops) or a processor that performs certain logic operations. In certain embodiments, the logic circuit 68 may be an output drive strength (ODS) logic circuit for reading data, an on-die termination (ODT) logic circuit for writing data, and the like. The logic circuit 68 may output a number of gate signals via wires 70, which may be coupled to certain switches 72.

The switches 72 may be any suitable switch circuit (e.g., MOSFET) that may open or close based on a provided gate signal. As shown in FIG. 2, the switches 72 may couple a voltage source (e.g., VDDQ) to the output buffer (e.g., 10 interface 16). Each switch 72 may represent a leg or phase in which the voltage source VDDQ may be coupled to the output buffer. In some embodiments, each leg may include a resistor (not shown) such that the line impedance of the connected switches 72 (e.g., internal switch on-resistance) and legs may be equal to some value, which may be specified by the memory device 10. For example, if the memory device 10 expects a 34-ohm line resistance to be present on the data path 46, seven switches 72 may be coupled together in parallel, such that each leg may include a 270-ohm resistor to provide a 34-ohm equivalent resistance when all seven of the switches 72 are closed.

To control the slew rate of the voltage provided to the data path 46 via the voltage source VDDQ, the logic circuit 68 may control the manner in which the switches 72 are closed. That is, if each of the switches 72 is closed at the same time, the voltage provided to the data path (e.g., via capacitor 74) may quickly rise to the voltage value of the voltage source VDDQ. In some cases, the voltage provided to the data path 46 may overshoot the voltage value of the voltage source VDDQ. To avoid overshooting the voltage value and to control the slew rate of the voltage signal provided on the data path 46, the logic circuit 68 may output gate signals to different sets of switches 72 or legs at certain intervals of time.

Figure 4:
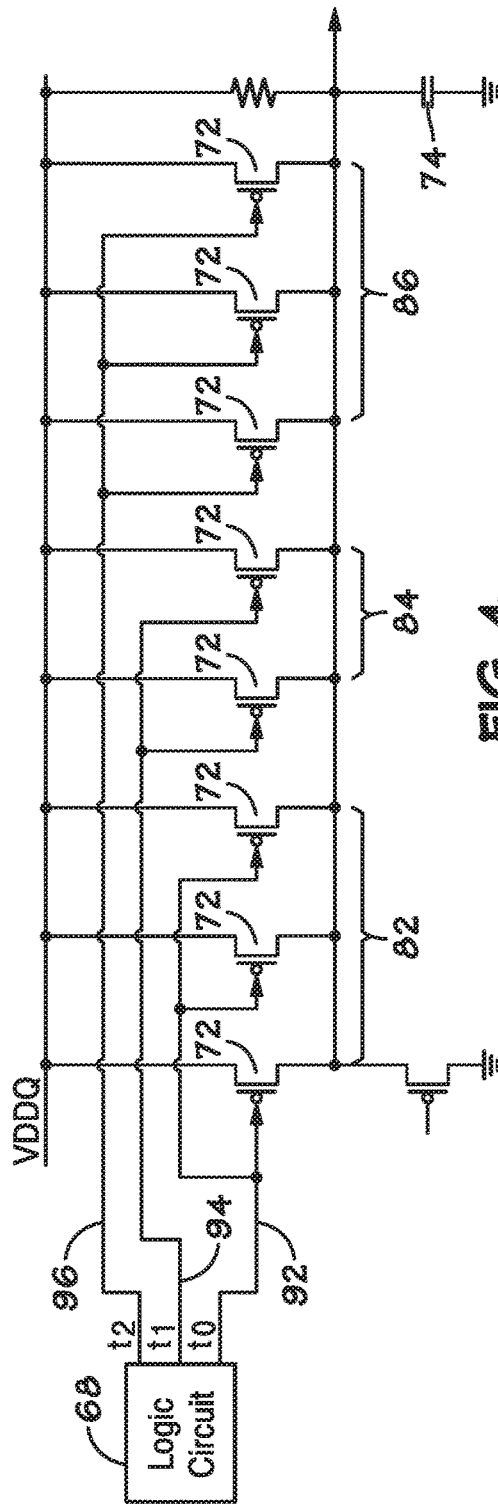
FIG. 4 illustrates an example wiring diagram of a collection of switches that may be controlled via the stagger delay circuitry of FIG. 2, according to an embodiment of the present disclosure.

Generally, the logic circuit 68 may receive a current signal via the RC circuit 62 and determine a strength of the current signal based on the current value. Based on the strength of the current signal, the logic circuit 68 may send a gate signal to a set of switches 72. For example, FIG. 4 illustrates an example wiring diagram between the logic circuit 68 and seven switches 72. Although FIG. 4 depicts seven switches 72 that couple the voltage source VDDQ to the data path 46, it should be noted that the seven switches 72 are merely an example number of switches that may be included in the present embodiments described herein. Indeed, any suitable number of switches 72 may be employed in the present embodiments. The number of switches 72 may be determined based on an expected line impedance associated with the memory device 10, a range of acceptable slew rates for the voltage signal received at the data path 46, and the like.

As shown in FIG. 4, the logic circuit 68 may be coupled to the switches 72 of phase 82 (e.g., collection of legs or switches 72), the switches 72 of phase 84, and the switches 72 of the phase 86 via wires 92, 94, and 96, respectively. The wires 92, 94, and 96 may include any suitable electrical wiring mechanism including wires, solder connections, etched conductive paths, and the like. In any case, each respective wire 92, 94, and 96 is coupled to a gate of a respective switch 72 of the phases 82, 84, and 86.

By way of operation, the logic circuit 68 may receive the current signal via the RC circuit 62, as discussed above, and determine whether the current signal is above a first threshold. Initially, the current signal may be high as the capacitor 66 is initially being charged. As such, the current signal may initially be above the first threshold, and the logic circuit may send a gate signal to the switches 72 of phase 82 via wire 92.

Figure 5:
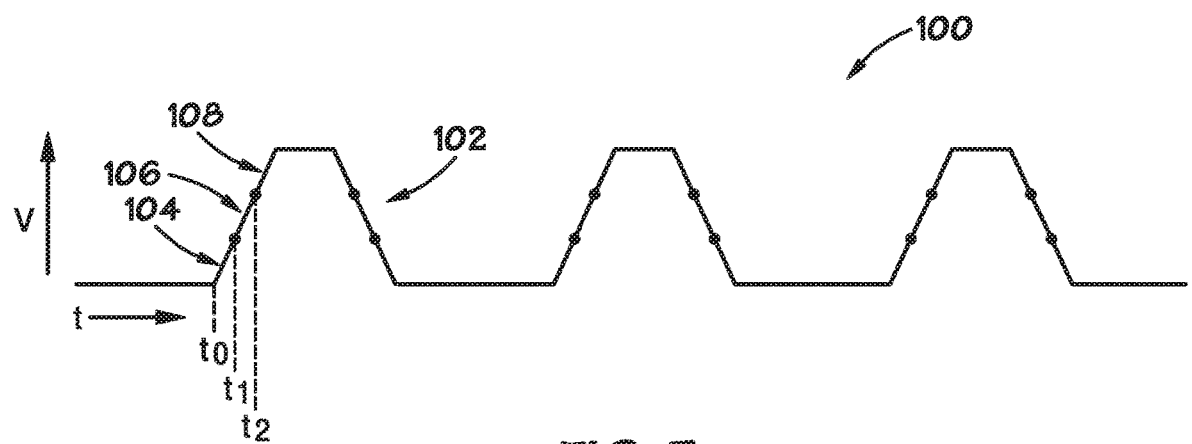
FIG. 5 illustrates a voltage signal having a slew rate that is controlled by the stagger delay circuitry of FIG. 2, according to an embodiment of the present disclosure.

For illustrative purposes, FIG. 5 depicts an example voltage waveform 100 of a voltage signal 102 that may be provided to the data path 46 via the switches 72 of the example circuit depicted in FIG. 4. As such, referring both to FIGS. 4 and 5, at time t0, the logic circuit 68 may output a gate signal to the switches 72 of the phase 82, thereby causing the voltage signal 102 to rise according to a first slew rate 104. That is, the three switches 72 may couple the voltage source VDDQ to the data path 46. In this way, if each leg of the phase 82 included a 240-ohm resistance, the equivalent resistance of the phase 82 would be 80 ohms (i.e., three parallel-connected 240-ohm resistors), which may affect the slew rate 104 of the voltage signal 102.

After the current signal received at the logic circuit 68 via the RC circuit 62 drops below the first threshold at time t1, the logic circuit 68 may send a gate signal to the switches 72 of the second phase 84. As a result, five switches 72 may couple the voltage source VDDQ to the data path 46. Assuming that the resistance of each leg is 240 ohms, the equivalent resistance of the connection between the voltage source VDDQ and the data path 46 is now 48 ohms, thereby causing the voltage signal 102 to adjust to slew rate 106 at time t1, as shown in FIG. 5.

At time t2, the current signal received at the logic circuit 68 via the RC circuit 62 drops below a second threshold. As such, the logic circuit 68 may send a gate signal to the switches 72 of the third phase 86, thereby cause seven switches 72 to couple the voltage source VDDQ to the data path 46. Again, assuming that the resistance of each leg is 240 ohms, the equivalent resistance of the connection between the voltage source VDDQ and the data path 46 is now approximately 34 ohms. Accordingly, the voltage signal 102 may again adjust to slew rate 108 at time t2, as shown in FIG. 5.

In certain embodiments, the thresholds that the logic circuit 68 may use to trigger the transmission of gate signals to different phases may be coordinated such that the delay between each transmission is constant or substantially constant (e.g., within 5%). As such, when determining the thresholds to employ, the logic circuit 68 may account for the number of phases of switches 72 that are present, a minimum slew rate specified for the memory device 10, a maximum slew rate for the memory device 10, the clock frequency in which the memory device 10 may read or write data, the voltage value of the voltage source VDDQ, and the like. In general, the thresholds may be selected such that the voltage signal 102 has a slew rate within the specified range and such that the time intervals between when gate signals are transmitted to separate phases are substantially uniform or constant. As memory devices 10 operate at shorter clock cycles (e.g., up to 3200 MHz or 325 ps), the switches 72 of different phases should be coordinated in such a manner to close at predictable times to ensure that the desired slew rate of the voltage signal 102 is achieved to enable the memory device 10 to sample the voltage signal 102 at a time in which the desired voltage value has been reached.

Moreover, although the stagger delay circuit 50 described herein is detailed as having seven legs and three phases of switches 72, it should be understood that this description of the stagger delay circuit 50 is provided as an example. That is, the stagger delay circuit 50 may include any suitable number of switches 72 grouped together in any suitable number of phases to control the slew rate of the voltage signal provided to the output buffer.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
   a plurality of memory banks;
   an output buffer configured to couple to the plurality of memory banks;
   a plurality of switches configured to couple a voltage source to the output buffer; and
   a stagger delay circuit, comprising:
      a resistor-capacitor (RC) circuit configured to output a current signal that corresponds to a data voltage signal received by the RC circuit; and
      a logic circuit configured to:
         determine a strength of the current signal; and
         send a first gate signal to a first portion of the plurality of switches based on the strength, wherein the first gate signal is configured to cause each of the first portion of the plurality of switches to close.

2. The semiconductor device of claim 1, wherein the logic circuit is configured to send the first gate signal in response to a current value of the current signal being above a first threshold.

3. The semiconductor device of claim 1, wherein the current signal is configured to decrease in value while charging a capacitor of the RC circuit.

4. The semiconductor device of claim 1, wherein the logic circuit is configured to send a second gate signal to a second portion of the plurality of switches in response to a current value of the current signal being below a first threshold.

5. The semiconductor device of claim 4, wherein the logic circuit is configured to send a third gate signal to a third portion of the plurality of switches in response to the current value of the current signal being below a second threshold.

6. The semiconductor device of claim 5, wherein a first time interval between sending the first gate signal and sending the second gate signal is substantially equal to a second interval between sending the second gate signal and the third gate signal.

7. The semiconductor device of claim 1, wherein the logic circuit is configured to adjust a slew rate of a voltage signal provided to the output buffer.

8. The semiconductor device of claim 1, wherein the RC circuit comprises a plurality of fuses configured to adjust a resistance of the RC circuit.

9. A method for controlling one or more operations of a semiconductor device, comprising:
   receiving, at a circuit, a current signal from a resistor-capacitor (RC) circuit, wherein the current signal corresponds to data received by the RC circuit;
   determining, at the circuit, a strength of the current signal; and
   transmitting, from the circuit, a first gate signal to a first set of switches within the semiconductor device based on the strength of the current signal, wherein the first gate signal is configured to cause the first set of switches to couple a voltage source to an output buffer, and wherein the output buffer is configured to couple to one or more memory banks.

10. The method of claim 9, comprising transmitting, from the circuit, a second gate signal to a second set of switches configured to couple the voltage source to the output buffer.

11. The method of claim 10, wherein the second gate signal is transmitted in response to the strength being below a threshold.

12. The method of claim 10, comprising transmitting a third gate signal to a third set of switches configured to couple the voltage source to the output buffer in response to the strength being below a second threshold.

13. The method of claim 12, wherein the first gate signal is transmitted at a first time, the second gate signal is transmitted at a second time, and the third gate signal is transmitted at a third time, wherein a first time interval between first time and the second time is substantially equal to a second time interval between third second time and the third time.

14. The method of claim 9, wherein the first gate signal is transmitted in response to the strength being above a threshold.

15. The method of claim 14, wherein the threshold is determined based on a target slew rate of a voltage signal provided to the output buffer.

16. A system comprising a processor for controlling one or more operations of a semiconductor device, wherein the processor is configured to:
  receive a current signal from a resistor-capacitor (RC) circuit, wherein the current signal corresponds to data received by the RC circuit;
  determine a strength of the current signal; and
  transmit a first gate signal to a first set of switches within the semiconductor device based on the strength of the current signal, wherein the first gate signal is configured to cause the first set of switches to couple a voltage source to an output buffer, and wherein the output buffer is configured to couple to one or more memory banks.

17. The system of claim 16, wherein the first gate signal is transmitted in response to a current value of the current signal being above a first threshold.

18. The system of claim 16, wherein the current signal is configured to decrease in value while charging a capacitor of the RC circuit.

19. The system of claim 16, wherein the processor is configured to send a second gate signal to a second portion of the plurality of switches in response to a current value of the current signal being below a first threshold.

20. The system of claim 19, wherein the processor is configured to send a third gate signal to a third portion of the plurality of switches in response to the current value of the current signal being below a second threshold.

* * * * *